United States Patent
Hara et al.

(10) Patent No.: US 8,384,124 B2
(45) Date of Patent: Feb. 26, 2013

(54) SEMICONDUCTOR DEVICE AND SEMICONDUCTOR INTEGRATED CIRCUIT DEVICE FOR DRIVING PLASMA DISPLAY USING THE SEMICONDUCTOR DEVICE

(75) Inventors: Kenji Hara, Hitachinaka (JP); Junichi Sakano, Hitachi (JP); Shinji Shirakawa, Moriya (JP)

(73) Assignee: Hitachi, Ltd., Tokyo (JP)

( * ) Notice: Subject to any disclaimer, the term of this patent is extended or adjusted under 35 U.S.C. 154(b) by 276 days.

(21) Appl. No.: 12/707,884

(22) Filed: Feb. 18, 2010

(65) Prior Publication Data
US 2010/0219448 A1 Sep. 2, 2010

(30) Foreign Application Priority Data
Mar. 2, 2009 (JP) ................................ 2009-047490

(51) Int. Cl.
*H01L 29/02* (2006.01)
(52) U.S. Cl. ................ 257/143; 257/E29.197; 257/355; 257/356; 257/357
(58) Field of Classification Search .................. 257/143, 257/E29.197, 355–357, 451–454
See application file for complete search history.

(56) References Cited

U.S. PATENT DOCUMENTS

| | | | | |
|---|---|---|---|---|
| 5,536,958 A * | 7/1996 | Shen et al. | | 257/356 |
| 5,894,139 A * | 4/1999 | Otsuki et al. | | 257/139 |
| 6,803,628 B1 * | 10/2004 | Hamada | | 257/342 |
| 7,095,639 B2 * | 8/2006 | Cho et al. | | 363/131 |
| 7,719,086 B2 * | 5/2010 | Ikuta et al. | | 257/556 |
| 7,932,538 B2 * | 4/2011 | Lee | | 257/139 |
| 2002/0177285 A1 * | 11/2002 | Feiler et al. | | 438/309 |
| 2004/0021203 A1 * | 2/2004 | Flohrs et al. | | 257/578 |
| 2004/0113172 A1 * | 6/2004 | Yasuda | | 257/197 |
| 2005/0167753 A1 * | 8/2005 | Mallikarjunaswamy et al. | | 257/360 |
| 2006/0049463 A1 * | 3/2006 | Kim | | 257/360 |
| 2008/0012040 A1 * | 1/2008 | Saito et al. | | 257/133 |
| 2008/0068369 A1 * | 3/2008 | Kobayashi | | 345/212 |
| 2008/0265278 A1 * | 10/2008 | Hara et al. | | 257/141 |
| 2008/0315251 A1 * | 12/2008 | Lee | | 257/141 |

FOREIGN PATENT DOCUMENTS
JP 05-055583 3/1993

OTHER PUBLICATIONS

Investigation on the Validity of Holding Voltage in High-Voltage Devices Measured by Transmission-Line-Pulsing (TLP),IEEE Electron Device Letters, vol. 29, No. 7, Jul. 2008.*

* cited by examiner

*Primary Examiner* — N Drew Richards
*Assistant Examiner* — Ankush Singal
(74) *Attorney, Agent, or Firm* — Antonelli, Terry, Stout & Kraus, LLP.

(57) ABSTRACT

The output circuit uses an IGBT incorporating a normal latch-up operation measure and the ESD clamp circuit uses an IGBT that can more easily latch up than the output circuit device which has the latch-up prevention layer lowered in impurity density or removed.

4 Claims, 4 Drawing Sheets

OPERATION OF THE ESD PROTECTIVE CIRCUIT
USING THE SAME IGBT AS IN OUTPUT CIRCUIT

OPERATION OF THE ESD PROTECTIVE CIRCUIT
USING THE IGBT OF THE PRESENT INVENTION

SEMICONDUCTOR DEVICE AND SEMICONDUCTOR INTEGRATED CIRCUIT DEVICE FOR DRIVING PLASMA DISPLAY USING THE SEMICONDUCTOR DEVICE

BACKGROUND OF THE INVENTION

The present invention relates to a semiconductor device using insulated gate bipolar transistors (hereinafter referred to as IGBTs) and to a plasma display driving semiconductor integrated circuit device using the IGBT semiconductor device.

An electrostatic breakdown of a semiconductor integrated circuit is caused by localized heating and electric field concentrations that occur when a discharge current from an electrostatic discharge (ESD) flows through the semiconductor device. With semiconductor devices being increasingly miniaturized in a higher density as their fabrication technology advances, the semiconductor devices in recent years tend to have a reduced capability to withstand ESD, making a problem of how to deal with the ESD an important issue. In high voltage power ICs using a SOI substrate, in particular, its structure in which an oxide layer (insulating film) with a low thermal conductivity surrounds the device causes a temperature increase from heating to be greater than when the device is formed on a Si substrate, giving rise to a possibility of having to take special considerations for the degraded ESD withstand capability.

One of conventional measures that have been taken against the ESD in semiconductor integrated circuits involves putting an ESD protective circuit between a high-voltage supply wire and a ground wire in parallel with a circuit being protected, to discharge ESD surges applied to external terminals. This method generally uses a diode or MOS transistor as a standard protective circuit device.

SUMMARY OF THE INVENTION

However, the conventional ESD protective circuit has some problems. For example, if devices of standard structure commonly used in circuits to be protected, such as output circuits, are installed in the ESD protective circuit, a high ESD withstand capability cannot be obtained. Another problem is that to improve the ESD withstand capability requires a special device design for the ESD.

To solve the above problems, in a semiconductor device having an electrostatic surge protective circuit formed between a first power supply wire and a ground wire, the present invention is characterized in that the protective circuit has an insulated gate bipolar transistor connected between a potential of the first power supply wire and a potential of the ground wire and that a latch-up initiation voltage of the insulated gate bipolar transistor is lower than a breakdown voltage of a semiconductor device connected to the first power supply wire and the output terminal.

Further, to solve the above problem, in a semiconductor device having an electrostatic surge protective circuit formed between a first power supply wire and a ground wire, the present invention comprises: an output circuit having an insulated gate bipolar transistor between the first power supply wire and an output terminal or between an output terminal and the ground wire; and an insulated gate bipolar transistor between a potential of the first power supply wire and a potential of the ground wire; wherein a latch-up initiation voltage of the insulated gate bipolar transistor of the protective circuit is lower than that of the insulated gate bipolar transistor of the output circuit.

Further, in the semiconductor device, the present invention is characterized in that the insulated gate bipolar transistor in the protective circuit has a lower impurity density in a first conduction type region provided to prevent a latch-up operation than that in a first conduction type region provided to prevent a latch-up operation of the insulated gate bipolar transistor in the output circuit.

Further, in the semiconductor device, the present invention is characterized in that a means is provided between a gate terminal of the insulated gate bipolar transistor in the protective circuit and the ground wire so that, when applied a voltage, it reduces impedance between the gate terminal and the ground wire.

Further, to solve the above problems, in a semiconductor device having an electrostatic surge protective circuit formed between a potential of a first power supply wire and a potential of a ground wire, the present invention comprises: an output circuit having an insulated gate bipolar transistor formed on a semiconductor substrate between the first power supply wire and an output terminal or between an output terminal and the ground wire; and an insulated gate bipolar transistor formed on the semiconductor substrate between a potential of the first power supply wire and a potential of the ground wire; wherein a latch-up initiation voltage of the insulated gate bipolar transistor of the protective circuit is lower than that of the insulated gate bipolar transistor of the output circuit.

Further, in the semiconductor device, the present invention is characterized in that the insulated gate bipolar transistor in the protective circuit has a lower impurity density in a first conduction type region provided to prevent a latch-up operation than that in a first conduction type region provided to prevent a latch-up operation of the insulated gate bipolar transistor in the output circuit.

Further, in the semiconductor device, the present invention is characterized in that the insulated gate bipolar transistor in the protective circuit and the insulated gate bipolar transistor in the output circuit are formed on the same semiconductor substrate.

Further, this invention uses the above-mentioned semiconductor as a plasma display driving semiconductor device.

The ESD protective circuit of this invention offers an improved ESD withstand capability by the use of the IGBT latch-up operation and also a size reduction. The ESD protective circuit can also eliminate an ESD-dedicated design. Further, with the use of an IGBT for low-voltage system (logic system), the ESD protective circuit is also applicable to a low-voltage ESD circuit.

Other objects, features and advantages of the invention will become apparent from the following description of the embodiments of the invention taken in conjunction with the accompanying drawings.

DETAILED DESCRIPTION OF THE INVENTION

Embodiments of this invention will be described in the following using the accompanying drawings.

[Embodiment 1]

Figure 1:
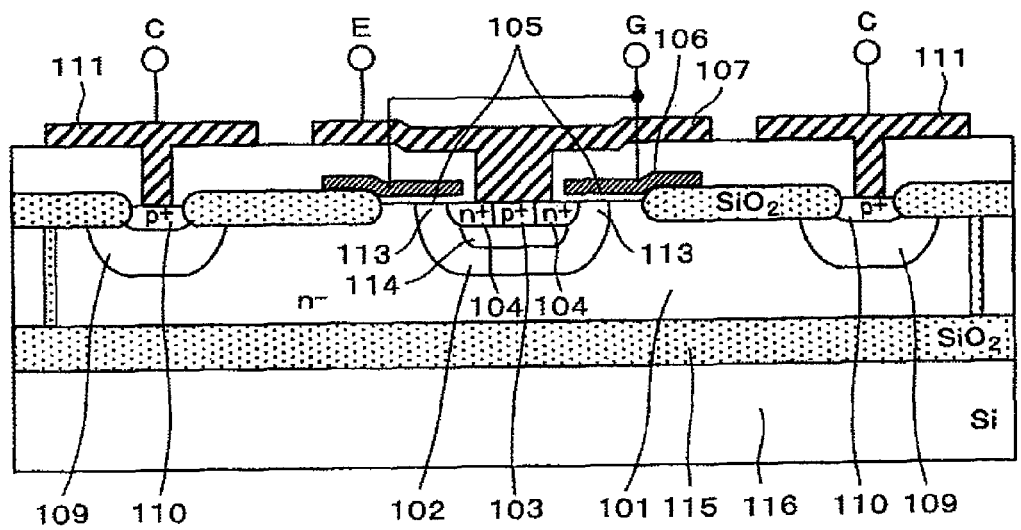
FIG. 1 is a cross-sectional construction of a first embodiment of a semiconductor device according to this invention.

FIG. 1 shows a cross-sectional structure representing one of embodiments of a lateral IGBT according to this invention. In FIG. 1, over the surface of an N-type substrate 101 is selectively formed a P base region 102, over parts of which two N emitter regions 104 are formed. Between the two N emitter regions 104, a P contact region 103 is formed so that it partly overlaps the N emitter regions 104. Over an exposed surface of the N-type substrate 101 where the P base region 102 is not formed, N buffer regions 109 are selectively formed. The surface of each of the N buffer regions 109 is formed with a P collector region 110. Then, on the surface of a channel region 113 of the surface layer of the P base region 102, a gate electrode 106 is provided which is connected to the G terminal through a gate oxide layer 105. Further, an emitter electrode 107 is formed in contact with both surfaces of the N emitter regions 104 and the P contact region 103, and a collector electrode 111 is provided over the surface of the P collector region 110. The emitter electrode 107 and the collector electrode 111 are connected to an E terminal and C terminal, respectively. Under the P contact region 103 and the N emitter regions 104 lies a latch-up prevention layer 114 to prevent a latch-up action of a parasitic bipolar transistor. The IGBT structure of this invention is characterized in that an impurity concentration in the latch-up prevention layer 114 is lowered to allow the IGBT to execute the latch-up operation more easily than a device used in an output circuit. Where the IGBT device is used in the output circuit, the same structure as the one shown in FIG. 1 can be used, except for the impurity concentration in the latch-up prevention layer 114. With this invention, an electrostatic protection is provided by the use of IGBT in the EST protection circuit which, when an ESD surge is applied to the external terminal, causes the IGBT to get latched up at a lower voltage than a breakdown voltage of other devices to discharge the ESD surge.

Figure 2:
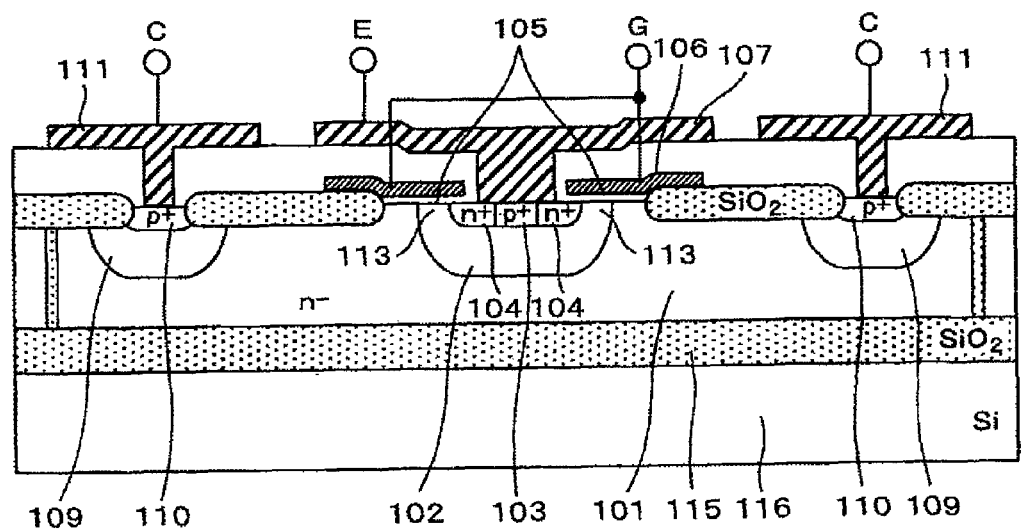
FIG. 2 is a cross-sectional construction of a second embodiment of a semiconductor device according to this invention.

FIG. 2 shows a cross-sectional structure of a second embodiment of this invention. This structure is the lateral IGBT of FIG. 1 removed of the latch-up prevention layer 114. Compared with FIG. 1, this structure can produce a latch-up action at an even lower voltage, allowing for an improved ESD withstand capability. Further, since the only condition that needs to be met in fabricating the semiconductor of this invention is not to form the latch-up prevention layer 114 for only the IGBT in the ESD protective circuit, the semiconductor device can be made with no additional fabrication process associated with the ESD device.

Figure 3:
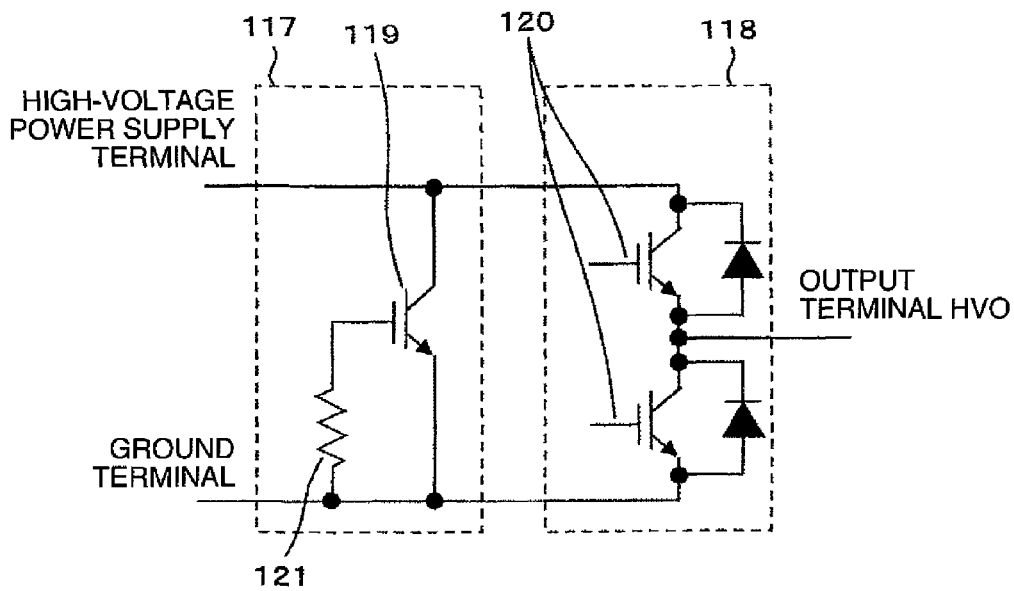
FIG. 3 is a circuitry of a first embodiment of an ESD protective circuit according to this invention.

FIG. 3 shows an example configuration of the ESD protective circuit using the IGBT of this invention. Between the high-voltage wire connected to a high-voltage power supply and the ground wire connected to the ground terminal is connected an IGBT 119 of this invention, which has a gate resistor 121 between its gate terminal and the ground wire. An output circuit 118 is constructed of two IGBTs 120 totem pole-connected between the high-voltage power wire and the ground, with a connecting point of the two IGBTs 120 taken out as an output terminal HVO. The output terminal HVO is put to either a high-voltage level, a ground level or a high-impedance state by the IGBTs 120 being on/off-controlled. The IGBT 119 is so configured as to be able to easily produce a latch-up for the IGBTs 120. If ESD surges are applied to an external terminal, such as output terminal HVO, a gate voltage of the protective circuit rises by a current through a parasitic capacity between the collector and gate of the IGBT 119. When the IGBT 119 turns on and the gate voltage exceeds a latch-up threshold level, the IGBT 119 in the latched-up state allows a large current to flow at a low voltage. Therefore, during the ESD surge discharge period, the semiconductor device has a shorter period of time when it is subjected to a large current and a high voltage, resulting in an improved ESD withstand capability. When not subjected to any ESD surges, the IGBT 119 has its gate terminal pulled down to the ground level through the gate resistor 121, maintaining its off-state.

Figure 4:
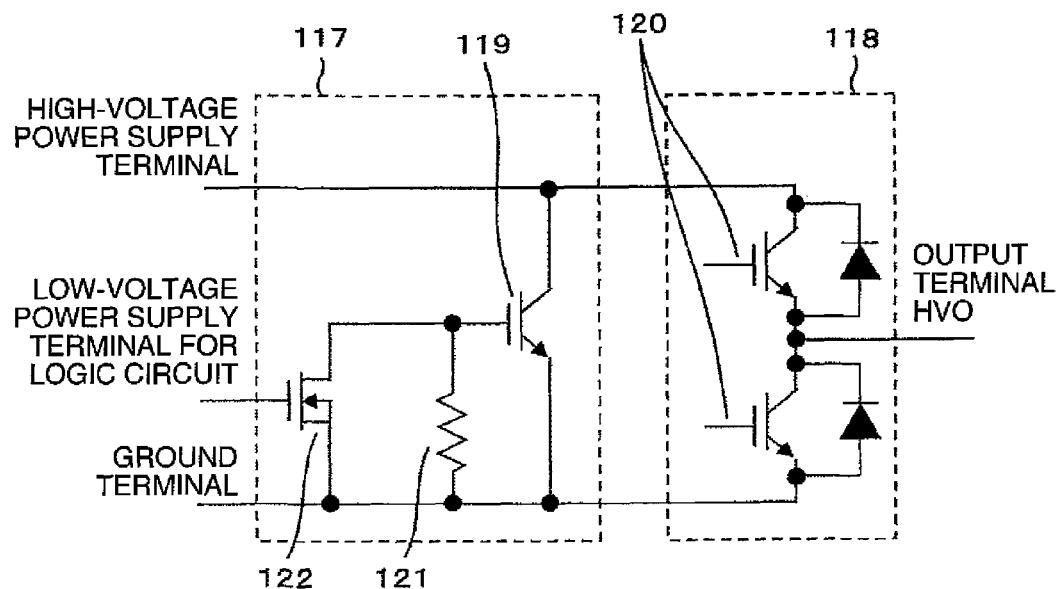
FIG. 4 is a circuitry of a second embodiment of an ESD protective circuit according to this invention.

FIG. 4 shows another example circuitry of the ESD protective circuit using the IGBT of this invention. Between a high-voltage wire connected to the high-voltage power supply and a ground wire connected to the ground terminal is connected the IGBT 119 of this invention, with the gate resistor 121 and a MOS transistor 122 connected between the gate terminal of the IGBT 119 and the ground wire. The gate terminal of the MOS transistor is connected to a logic circuit low-voltage power supply for semiconductor integrated circuits. The output circuit 118 has the same configuration as that shown in FIG. 3. If ESD surges are applied to the external terminal, the IGBT 119, as in the case of FIG. 3, turns on earlier than other devices and enters into the latch-up state, working as the ESD protective circuit. In normal use, the MOS transistor 122 is turned on by the application of the logic circuit power supply to hold the gate terminal of the IGBT 119 to the ground potential through a low impedance, preventing an undesired operation of the ESD protective circuit which would otherwise be caused by the IGBT 119 erroneously turning on as the high-voltage power supply voltage varies.

Figure 5A:
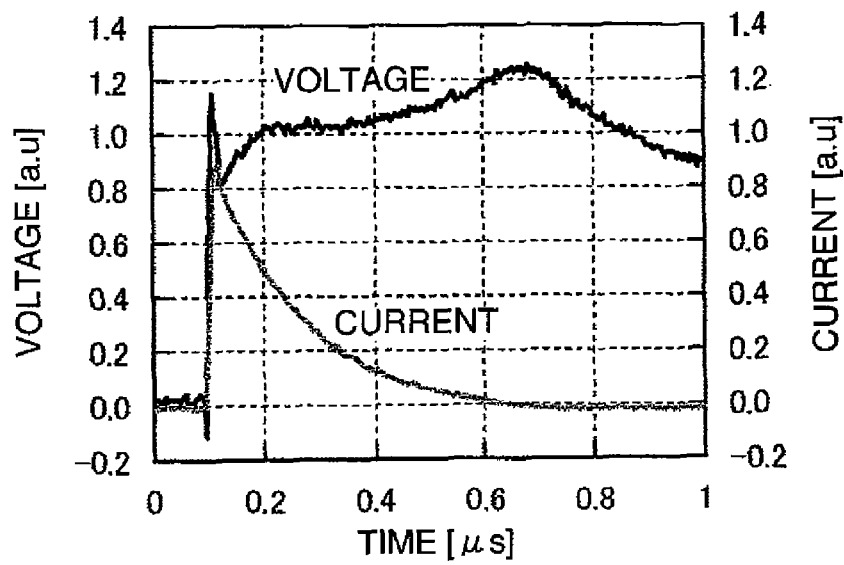
FIGS. 5A and 5B are characteristic diagrams of the semiconductor devices of this invention.
Figure 5B:
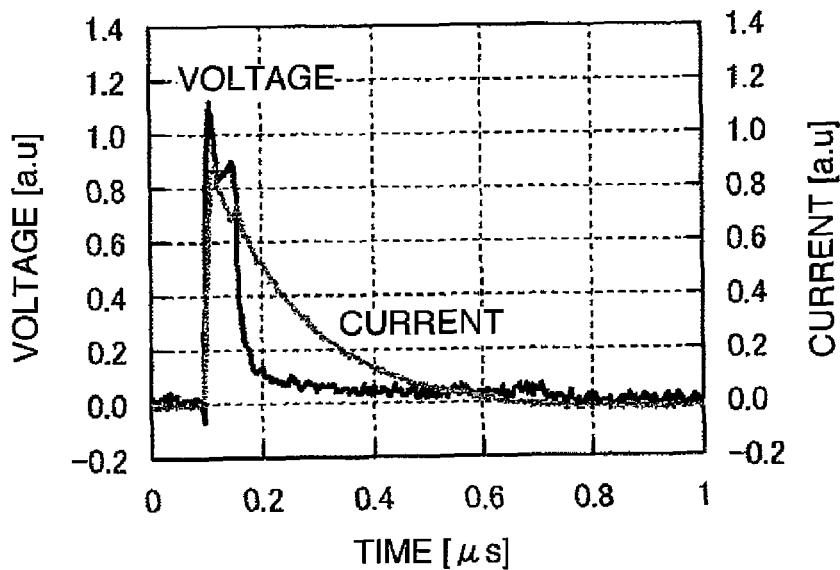

FIG. 5A and FIG. 5B show voltage-current waveforms obtained when the same ESD surges were applied to a semiconductor integrated circuit with an ESD protective circuit using an IGBT of the same configuration as that of the output stage circuit and also to a semiconductor integrated circuit with an ESD protective circuit using the IGBT of the embodiment of this invention. The ESD was applied under a HBM (Human Body Model) condition (charging capacity of 100 pF, connection resistance of 1.5 kΩ).

It is seen from the current-voltage graph of FIG. 5B that the ESD protective circuit using the IGBT of this invention, when operated, reduces the voltage applied to the semiconductor integrated circuit, shortening the large-current, high-voltage period. This shows that the ESD protective circuit using the IGBT shown in the embodiment of this invention can provide a high ESD withstand capability.

Figure 6:
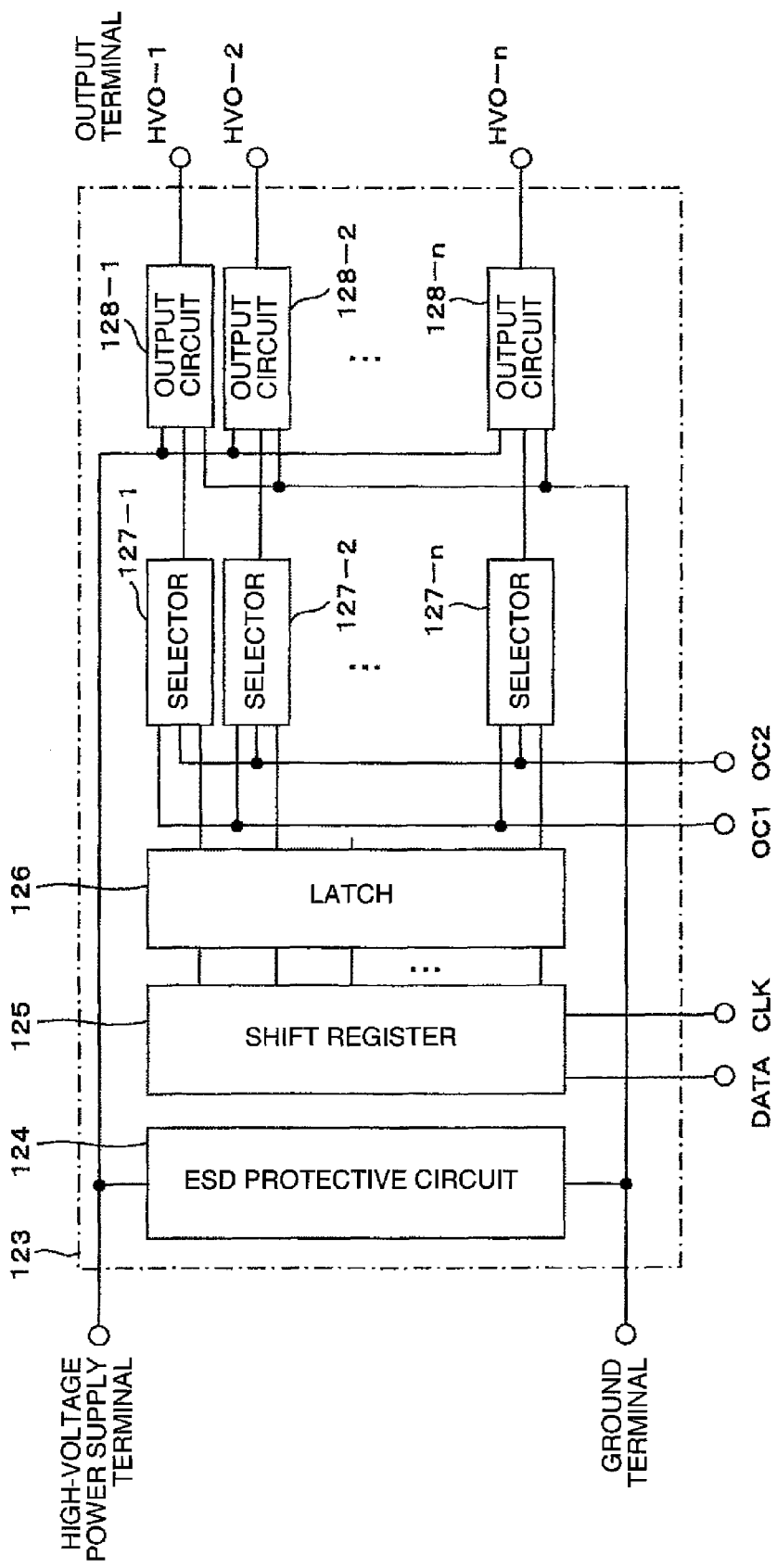
FIG. 6 shows an example configuration of a plasma display driving semiconductor integrated circuit device using the semiconductor device of this invention.

FIG. 6 shows an example configuration of a plasma display driving semiconductor integrated circuit device with an ESD protective circuit using the IGBT of this invention.

The plasma display driving semiconductor integrated circuit device 123 has an ESD protective circuit 124, a shift register circuit 125, a latch circuit 126, a selector 127 and an output stage circuit 128. The shift register circuit 125 shifts a control signal entered from the terminal DATA in synchronism with a clock signal supplied to the terminal CLK. By a combination of terminals OC1 and OC2 connected to the selector 127, all output terminals are set to a high-voltage VH level, a GND voltage level, a high-impedance state, or a data-output-from-latch state. The output stage circuit 128 has IGBTs totem pole-connected between the high-voltage power supply and the ground, with a connecting point of the IGBTs taken out as an output terminal HVO. Depending on the state of OC1 and OC2, the IGBTs are turned on or off to set the output terminal HVO to a high potential VH, a GND potential or a high-impedance state.

The ESD protective circuit 124 has a construction of FIG. 3, for example. When an ESD surge is impressed to a high-voltage power supply terminal, a ground terminal or an output terminal, the IGBT in the ESD circuit gets latched up at a lower voltage level than other devices to execute the ESD protection operation. In the preceding embodiment, the insulated gate bipolar transistor of the protective circuit and the insulated gate bipolar transistor in the output circuit can be constructed on the same semiconductor substrate. This can be realized by providing an $SiO_2$ insulating separation strip for each insulated gate bipolar transistor on the same semiconductor substrate.

This invention can be applied to an ESD protective circuit using lateral type insulated gate bipolar transistors (IGBTs) formed on an SOI substrate and also to a plasma display driving semiconductor integrated circuit.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A semiconductor device having an electrostatic surge protective circuit formed between a first power supply wire and a ground wire, comprising:
    an output circuit having an insulated gate bipolar transistor between the first power supply wire and an output terminal or between an output terminal and the ground wire;
    an insulated gate bipolar transistor between a potential of the first power supply wire and a potential of the ground wire;
    wherein a latch-up initiation voltage of the insulated gate bipolar transistor of the protective circuit is lower than that of the insulated gate bipolar transistor of the output circuit,
    wherein the insulated gate bipolar transistor in the protective circuit has a lower impurity density in a first conduction type region provided to prevent a latch-up operation than that in a first conduction type region provided to prevent a latch-up operation of the insulated gate bipolar transistor in the output circuit.

2. A semiconductor device according to claim 1,
    wherein a means is provided between a gate terminal of the insulated gate bipolar transistor in the protective circuit and the ground wire so that, when applied a voltage, it reduces impedance between the gate terminal and the ground wire.

3. A semiconductor device having an electrostatic surge protective circuit formed between a potential of a first power supply wire and a potential of a ground wire, comprising:
    an output circuit having an insulated gate bipolar transistor formed on a semiconductor substrate between the first power supply wire and an output terminal or between an output terminal and the ground wire; and
    an insulated gate bipolar transistor formed on the semiconductor substrate between a potential of the first power supply wire and a potential of the ground wire;
    wherein a latch-up initiation voltage of the insulated gate bipolar transistor of the protective circuit is lower than that of the insulated gate bipolar transistor of the output circuit,
    wherein the insulated gate bipolar transistor in the protective circuit has a lower impurity density in a first conduction type region provided to prevent a latch-up operation than that in a first conduction type region provided to prevent a latch-up operation of the insulated gate bipolar transistor in the output circuit.

4. A semiconductor device according to claim 3,
    wherein the insulated gate bipolar transistor in the protective circuit and the insulated gate bipolar transistor in the output circuit are formed on the same semiconductor substrate.

* * * * *